(12) United States Patent
Staines

(10) Patent No.: US 7,701,091 B2
(45) Date of Patent: Apr. 20, 2010

(54) MARX GENERATOR AND USE OF A HIGH-VOLTAGE CABLE FOR HIGH-VOLTAGE DECOUPLING

(75) Inventor: Geoffrey Staines, San Diego, CA (US)

(73) Assignee: Diehl BGT Defence GmbH & Co, KG, Überlingen (DE)

( * ) Notice: Subject to any disclaimer, the term of this patent is extended or adjusted under 35 U.S.C. 154(b) by 415 days.

(21) Appl. No.: 11/587,501

(22) PCT Filed: Apr. 12, 2005

(86) PCT No.: PCT/EP2005/003797

§ 371 (c)(1),
(2), (4) Date: Aug. 29, 2007

(87) PCT Pub. No.: WO2005/104367

PCT Pub. Date: Nov. 3, 2005

(65) Prior Publication Data

US 2008/0116750 A1    May 22, 2008

(30) Foreign Application Priority Data

Apr. 26, 2004  (DE) ..................... 10 2004 020 342

(51) Int. Cl.
*H03K 3/00* (2006.01)
*H03K 3/64* (2006.01)

(52) U.S. Cl. .................................................... 307/108
(58) Field of Classification Search ................ 307/106, 307/108, 109
See application file for complete search history.

(56) References Cited

U.S. PATENT DOCUMENTS

| 6,822,394 B2 | 11/2004 | Staines et al. | |
| 2002/0105773 A1* | 8/2002 | Seely et al. | ............. 361/263 |
| 2008/0119921 A1* | 5/2008 | Brace et al. | ............. 607/156 |

OTHER PUBLICATIONS

Siemens-Zeitschrift, 46, Jahrgang, Jan. 1972; Heft 1, Seuteb 48-54.

* cited by examiner

*Primary Examiner*—Albert W Paladini
*Assistant Examiner*—Carlos Amaya
(74) *Attorney, Agent, or Firm*—Scully, Scott, Murphy & Presser, P.C.

(57) ABSTRACT

In order to decouple the low-voltage charging source and its electrical drive from the high voltage which occurs in a Marx generator when the capacitor bank is switched from parallel connection to series connection, the high-voltage cable which is used on the output side and in which the conductive core is surrounded by a semiconductor for potential matching is also used on the input side, but for high-voltage decoupling after removal of the current-carrying core. Only the semiconductor in the high-voltage cable therefore remains as a resistance line for the small charging current into the parallel-connected capacitor bank of the Marx generator.

1 Claim, No Drawings

MARX GENERATOR AND USE OF A HIGH-VOLTAGE CABLE FOR HIGH-VOLTAGE DECOUPLING

CROSS-REFERENCE TO RELATED APPLICATIONS

This application claims the benefit of European Application PCT/EP2005/003797; and the priority of German Patent Application 102004020342.3, filed Apr. 26, 2004.

BACKGROUND OF THE INVENTION

1. Field of the Invention

The invention relates to a Marx generator and to use of a high-voltage cable for its high-voltage decoupling on the charging side.

The impulse-voltage generator discovered by Professor Marx (Braunschweig TU) in 1923 is used to produce a high-voltage pulse, for example for insulation-testing purposes, to investigate the behavior of gases in strong electrical fields or, according to DE 101 51 565 A1, to stimulate a resonator to emit high-power microwave energy.

The basic function of the Marx generator is based on a number n (n=1, 2, 3, . . . , i) of capacitors connected in parallel with one another being charged to an input voltage produced by a DC voltage source, and then being connected in series so that n-times the input voltage is available as the output voltage across this series circuit. In this case, the change from parallel connection to series connection of the capacitor bank is carried out by means of spark gaps which all ignite virtually at the same time when a first of them responds. The response of a first spark gap can be predetermined by means of its response voltage, that is to say by means of the cross-section geometry and the distance between the spark-gap electrodes; alternatively, the response of a first of the spark gaps is initiated by a trigger pulse supplied to it externally. Decoupling resistors, which also act as charging resistors that govern the time constants, prevent one of the two capacitors, between which a spark gap in order to connect them in series is located, being short-circuited as a result of the ignition of the spark gap. In consequence, the series connection of the charging and decoupling resistors when the capacitor bank is changed to be connected in series acts as a high-voltage voltage divider; and then both the input-side voltage source of the Marx generator and its output-side output line are connected to a high-voltage potential with respect to the common ground potential.

2. Discussion of the Prior Art

A commercially available electronic voltage converter is normally used as the voltage source for the Marx generator, is fed from a power supply system or from a chargeable battery, and charges the parallel circuit formed by the capacitor bank to a voltage of typically several 10 kV. The high-voltage reaction on the electronic system or from a chargeable battery, and charges the parallel circuit formed by the capacitor bank to a voltage of typically several 10 kV. The high-voltage reaction on the electronic circuit of this input-side voltage source on switching the capacitor bank from being parallel connected to being series connected is then functionally critical. This can lead to an adverse affect on the operation of the voltage source, or even to its destruction, so that stable long-term operation of the Marx generator, for example for continuous excitation of a microwave resonator, is not possible. Because of the high voltage load, conventional filter methods cannot be used in this case between the voltage source and the capacitor bank of the Marx generator, and the use of special high-voltage resistors for decoupling would be too costly.

SUMMARY OF THE INVENTION

With the knowledge of these circumstances, the present invention is based on the technical problem of designing the input side of the Marx generator to be high-voltage resistant, using means which are available easily and at low cost.

This object is achieved according to the invention in that an electrical decoupling in the form of a dielectric line of reasonably good conductivity is provided between the capacitor bank and the voltage source. In this case, the term dielectric means any material whose conductivity is less than that of an electrical conductor so that it thus also has certain insulation characteristics. The dielectric line, or else the dielectric cable, may be formed from a dielectric insert and its sheath. The sheath may in this case be formed from a single layer, for example a surge protective layer, an isolation layer, a wear-resistant layer, etc., or from a plurality of such layers. According to the exemplary embodiment, a line such as this is available in the form of a commercially available, and therefore low-cost, high-voltage cable with a dielectric insert, when the actual conductor core is removed from this; so that only the flexible tube composed of semiconductive material, that is to say the dielectric insert, remains in the insulating casing or the sheath, which flexible tube actually surrounds the conductor core and is provided for the purpose of preventing a sudden potential jump, which is critical because of the destructive corona effects in the interior of the cable, between the cable core and the insulation.

DETAILED DESCRIPTION OF THE INVENTION

The dielectric insert in the dielectric high-voltage cable has a typical electrical resistance of about 50 to 200 ohm/cm of length of the dielectric insert in the cable. The high-voltage cable without the cable core but still fitted just with the semiconductor run typically has a preferred electrical resistance of about 100 ohm per cm of length of the semiconductor insert in the cable. This continuity resistance from the voltage source to the capacitor bank does not lead to functionally critical voltage losses, because the parallel-connected capacitors are typically charged with a charging current in the order of magnitude of only up to about 10 mA. When a pulsed high voltage is applied from the switched-over capacitor bank to the dielectric decoupling line, this does not in its own right lead to functionally critical effects on the electronics in the voltage converter, because of the time constant which is now effective in this case, as the product of the semiconductor resistance and the parasitic capacitances.

Thus, for practical embodiment, the input side of a dielectric cable, in particular a commercially available high-voltage cable is now made use of, in addition to the output line on the output side of the Marx generator, for connection to, for example, a microwave resonator; however, for the input-side use of the high-voltage cable for high-voltage decoupling, the intrinsically conductive (copper) cable core is withdrawn from its semiconductive sheath in the dielectric casing of the high-voltage cable, so that the high-voltage cable in the dielectric casing in this case still has only the semiconductive material as a dielectric resistance between the voltage source and the capacitor bank of the Marx generator.

The invention claimed is:

1. Use of a high-voltage cable with a dielectric insert for high-voltage decoupling between a capacitor bank of a Marx generator and a charging voltage source thereof, wherein said high-voltage cable is a commercially available cable with a dielectric insert, and wherein the cable core which is sheathed by the dielectric insert has been withdrawn from said cable.

* * * * *